United States Patent
Lewin et al.

(10) Patent No.: US 10,959,323 B1
(45) Date of Patent: Mar. 23, 2021

(54) OVER-TORQUE PROTECTION FEATURES FOR MOUNTING AN ELECTRONIC DEVICE TO A HEAT DISSIPATION OBJECT

(71) Applicant: Performance Motion Devices, Inc., Westford, MA (US)

(72) Inventors: Emanuel Gustav Lewin, Lincoln, MA (US); Steven M. Johnson, Chelmsford, MA (US); Arthur R. Nigro, Hopkinton, MA (US); Peng Li, Bolton, MA (US); Peter Vandermeulen, Newburyport, MA (US); Prabhakar Gowrisankaran, Andover, MA (US); Andrew Colletta, Westford, MA (US); Ahmad Shouman, Chelmsford, MA (US)

(73) Assignee: Performance Motion Devices, Inc., Westford, MA (US)

( * ) Notice: Subject to any disclaimer, the term of this patent is extended or adjusted under 35 U.S.C. 154(b) by 0 days.

(21) Appl. No.: 16/665,529

(22) Filed: Oct. 28, 2019

Related U.S. Application Data

(60) Provisional application No. 62/896,881, filed on Sep. 6, 2019.

(51) Int. Cl.
*H05K 1/02* (2006.01)
*H05K 1/18* (2006.01)
*H05K 7/14* (2006.01)

(52) U.S. Cl.
CPC ......... *H05K 1/0271* (2013.01); *H05K 1/0203* (2013.01); *H05K 1/181* (2013.01);
(Continued)

(58) Field of Classification Search
CPC .... H05K 1/0203; H05K 1/0271; H05K 1/181; H05K 7/1427; H05K 2201/066;
(Continued)

(56) References Cited

U.S. PATENT DOCUMENTS 6,579,123 B2   6/2003 Kasahara
6,696,769 B2   2/2004 Lee
(Continued)

FOREIGN PATENT DOCUMENTS

EP   1661771 A1   5/2006
EP   2902242 A1   8/2015
(Continued)

OTHER PUBLICATIONS

Infineon data sheet, Technical Information FP15R12KE3 (dated Feb. 13, 2002).

*Primary Examiner* — Jacob R Crum
(74) *Attorney, Agent, or Firm* — Hamilton, Brook, Smith & Reynolds, P.C.

(57) ABSTRACT

A package for securing a PCB to a heatsink includes mounts with over-torque protection features. The PCB is seated in an open end of the package. Each mount includes a threaded opening for securing the package to the heatsink such that the base layer of the PCB is thermally coupled to the heat sink. The over-torque protection features are connected between the threaded opening and a sidewall of the package. The over-torque protection features may be designed to structurally fail and/or deform in response to over-torqueing of the fasteners, thereby inhibiting flexure of the PCB.

35 Claims, 21 Drawing Sheets

(52) U.S. Cl.
CPC ..... *H05K 7/1427* (2013.01); *H05K 2201/066* (2013.01); *H05K 2201/10015* (2013.01); *H05K 2201/10166* (2013.01); *H05K 2201/10522* (2013.01)

(58) Field of Classification Search
CPC .......... H05K 2201/10015; H05K 2201/10166; H05K 2201/10522
See application file for complete search history.

(56) References Cited

U.S. PATENT DOCUMENTS

| | | | |
|---|---|---|---|
| 6,728,110 B2 | 4/2004 | Koyama | |
| 7,139,175 B2 | 11/2006 | Hofmann | |
| 7,291,024 B2 * | 11/2007 | Kiyota | B60R 16/0238 439/34 |
| 7,622,671 B2 * | 11/2009 | Yamamoto | B60R 16/0215 174/481 |
| 8,288,658 B2 | 10/2012 | Uchida | |
| 8,500,461 B2 * | 8/2013 | Tseng | H01Q 1/243 439/74 |
| 8,627,564 B2 * | 1/2014 | Blossfeld | H05K 7/1428 29/883 |
| 9,688,228 B2 | 6/2017 | Azuma | |
| 10,616,993 B1 * | 4/2020 | Gawlowski | H05K 7/20418 |
| 2009/0086431 A1 | 4/2009 | Sakamoto | |
| 2009/0086454 A1 | 4/2009 | Sakamoto | |
| 2009/0086455 A1 | 4/2009 | Sakamoto | |
| 2009/0091899 A1 | 4/2009 | Saito | |
| 2009/0103276 A1 | 4/2009 | Sakamoto | |
| 2011/0085307 A1 * | 4/2011 | Burgi | H05K 5/0073 361/752 |
| 2011/0310574 A1 | 12/2011 | Nomoto | |
| 2012/0153391 A1 * | 6/2012 | Rotay | H01L 25/115 257/343 |
| 2012/0158166 A1 * | 6/2012 | Rotay | H01L 25/115 700/97 |
| 2012/0164792 A1 * | 6/2012 | Rotay | H01L 23/32 438/118 |
| 2014/0285973 A1 | 9/2014 | Hong | |
| 2015/0330566 A1 | 11/2015 | Inoue | |
| 2017/0196075 A1 * | 7/2017 | Barron | H01L 23/40 |
| 2019/0006262 A1 | 1/2019 | Lewin | |

FOREIGN PATENT DOCUMENTS

| | | |
|---|---|---|
| JP | 2000350331 A | 12/2000 |
| JP | 2006130352 A | 5/2006 |
| JP | 2010241387 A | 10/2010 |
| JP | 2013066333 A | 4/2013 |

* cited by examiner

Detail A

Section B-B

Detail A

Section B-B

Section C-C

Threaded
Insert
210

OVER-TORQUE PROTECTION FEATURES FOR MOUNTING AN ELECTRONIC DEVICE TO A HEAT DISSIPATION OBJECT

RELATED APPLICATION

This application claims the benefit of U.S. Provisional Application No. 62/896,881, filed on Sep. 6, 2019. The entire teachings of the above application are incorporated herein by reference.

BACKGROUND

Electronic devices typically include various components mounted on a PCB (Printed Circuit Board). If any of the components generate significant amounts of heat, then the device may be thermally coupled to a heat dissipation object. For example, the PCB may be bolted or clamped to a heat sink with a thermally conductive paste, gel, or pad placed therebetween to fill potential air gaps between contact surfaces, and provide a thermal transfer path.

Aluminum PCBs are particularly well suited for electronic devices that generate significant heat. Aluminum PCBs have an aluminum base layer, a dielectric layer and a copper circuit layer. The dielectric and copper circuit layers may be similar or identical to the dielectric and copper circuit layers of common FR4 PCBs. However, the aluminum base layer has better thermal transmittance characteristics than FR4. An aluminum PCB with a 1.5 mm thick base layer has a thermal resistance of about 1-2 degrees per watt, whereas an FR4 PCB with a 1.5 mm thick base layer has a thermal resistance of about 20-22 degrees per watt. Consequently, aluminum PCBs may be preferred for electronic devices for which a heat sink is required.

A problem that may be encountered with electronic devices that are fastened to another object is that surface-mounted components may be damaged by flexure of the PCB. For example, an aluminum PCB that is secured to a heat sink with multiple machine screws that exert enough force to assure contact, and thus thermal coupling, between a flat surface of the heat sink and the entire lower surface of the aluminum PCB may flex during installation if torqueing of the fasteners is not accurately controlled. If either the aluminum base layer or the mounting surface of the heat sink is non-planar, then the aluminum base layer may flex if the fasteners are over-tightened. Even if both the aluminum base layer and the mounting surface of the heat sink are planar, foreign matter located between the surfaces being mated may cause the aluminum base layer to flex if the fasteners are over-tightened. Further, the conductive paste, gel, or pad that is intentionally placed between the surfaces being mated may cause the aluminum base layer to flex if the fasteners are over-tightened. In general, the thickness of the material is proportional or inversely proportional to the likelihood that flexing will occur. Many types of electronic components are relatively tolerant to flexing of the aluminum base layer. However, certain types of components such as surface-mounted ceramic capacitors are more susceptible to damage caused by flexing of the aluminum base layer.

SUMMARY

All examples, aspects and features mentioned in this document can be combined in any technically possible way.

In accordance with some aspects of the invention an electronic device comprises: an electronic circuit comprising one or more or a plurality of electronic components mounted to a printed circuit board comprising a thermally conductive substrate layer; and a package against which the printed circuit board is seated, the package comprising at least one sidewall and one or more or a plurality of mounts via which the electronic device is secured to a heat dissipation object, each mount comprising an opening via which the mount is fastenable to the heat dissipation object and an over-torque protection feature connected between the opening and the sidewall.

In some implementations the over-torque protection feature comprises at least one structural member that is a structurally weakest link between the opening and the sidewall. In some implementations the over-torque protection feature comprises at least one rectangular cuboid bar that interconnects a body of the mount with the sidewall. In some implementations the over-torque protection feature comprises first and second rectangular cuboid bars with a void therebetween. In some implementations the rectangular cuboid bars are oriented with longest surfaces in a first axis that is parallel to an axis defined by a length dimension of a first fastener in the threaded opening. In some implementations the opening is disposed in a cylindrical section and the over-torque protection feature comprises first and second rectangular cuboid bars that connect the cylindrical section to a body of the mount. In some implementations the first and second rectangular cuboid bars are offset by 180 degrees relative to the opening. In some implementations the opening is disposed in a wedge section and the over-torque protection feature comprises the wedge and a correspondingly-shaped opening in a body of the mount. In some implementations the wedge has a truncated polyhedron shape. In some implementations the over-torque protection feature comprises a receiver and a removable tab. In some implementations the receiver comprises a spring beam and the removable tab comprises a cross-beam with a projection that contacts the spring beam. In some implementations the mount is fastenable to the heat dissipation object with a machine screw. In some implementations the thermally conductive substrate layer forms an end-wall of the electronic device. In some implementations an air gap is present between the mount and the heat dissipation object. In some implementations structural failure of the over-torque protection feature creates an audible noise. In some implementations the package comprises solderable mounting posts.

In particular embodiments, each mount of the package can be securable to the heat dissipation object by a fastener extending within the opening of the mount along an axis A. Each mount can have a configuration that allows the package to be tightened by the fastener to the heat dissipation object securely under normal assembly conditions, but also providing a readily apparent mechanical indication of over-torque or force applied to the fastener along the axis A when a predetermined threshold torque or force level is reached while tightening the fastener for preventing the fastener from being tightened over or above the predetermined threshold torque or force level. The readily apparent mechanical indication can include visual indications which can also cause or include audible indications. Each mount can be configured to be generally stable during tightening the fastener along axis A until reaching a predetermined threshold torque or force level at which at least a portion of the mount undergoes, experiences or is caused to have a mechanical alteration. The mechanical alteration can be at least one of deformation, deflection, bending, fracture, slippage, damage, breakage, failure and movement.

In accordance with some aspects of the invention, a package for an electronic circuit including one or more or a plurality of electronic components mounted to a printed circuit board including a thermally conductive substrate layer, comprises: at least one sidewall against which the printed circuit board is seated and one or more or a plurality of mounts via which the printed circuit board is secured to a heat dissipation object, each mount comprising an opening via which the mount is fastenable to the heat dissipation object and an over-torque protection feature connected between the opening and the sidewall, the over-torque protection feature comprising at least one structural member that is a structurally weakest link between the opening and the sidewall.

In some implementations the over-torque protection feature comprises first and second rectangular cuboid bars with a void therebetween. In some implementations the opening is disposed in a cylindrical section and the over-torque protection feature comprises first and second rectangular cuboid bars that connect the cylindrical section to a body of the mount. In some implementations the opening is disposed in a wedge section and the over-torque protection feature comprises the wedge and a correspondingly-shaped opening in a body of the mount.

In particular embodiments, each mount of the package can be securable to the heat dissipation object by a fastener extending within the opening of the mount along an axis A. Each mount can have a configuration that allows the package to be tightened by the fastener to the heat dissipation object securely under normal assembly conditions, but also providing a readily apparent mechanical indication of over-torque or force applied to the fastener along the axis A when a predetermined threshold torque or force level is reached while tightening the fastener for preventing the fastener from being tightened over or above the predetermined threshold torque or force level. Each mount can be configured to be generally stable during tightening the fastener along axis A until reaching a predetermined threshold torque or force level at which at least a portion of the mount undergoes, experiences or is caused to have a mechanical alteration. The mechanical alteration can be at least one of deformation, deflection, bending, fracture, slippage, damage, breakage, failure and movement.

The present invention can also provide a housing for mounting a printed circuit board to a surface. The housing can include at least one sidewall for engaging the printed circuit board, and can be formed of a rigid plastic material. One or more mounts can be integrally formed with the at least one sidewall and extend generally perpendicular therefrom in a cantilevered manner. Each mount can have an opening extending therethrough along an axis A that is generally parallel to the at least one sidewall for allowing the mount to be secured to the surface with a fastener. The mount can have a thickness dimension in the direction of axis A and have two spaced apart bars separated by slot extending along said thickness dimension that connect the mount to the at least one sidewall. The two bars can be configured, shaped and sized to fail when a fastener that is being tightened exerts a force along axis A that reaches a predetermined threshold level of torque or force for protecting the printed circuit board from excessive flexing during fastening.

In particular embodiments, the two bars can each be recessed relative to lateral sides of the mount form a stress concentration line on the bars along said thickness dimension parallel to axis A. The predetermined threshold torque level can be about 1.5 to 3 inch pounds (in lbs.).

The present invention can also provide a method of securing an electronic device to a heat dissipation object. An electronic circuit can be provided comprising one or more electronic components mounted to a printed circuit board comprising a thermally conductive substrate layer. The printed circuit board can be seated against a package. The package can comprise at least one sidewall and one or more mounts. The electronic device can be secured to the heat dissipation object. Each mount can comprise an opening via which the mount is fastenable to the heat dissipation object and an over-torque protection feature can connect between the opening and the sidewall for protecting the printed circuit board from excessive flexing during fastening. Particular embodiments of the method can further include certain details described above.

The present invention can also provide a method of securing a package for an electronic circuit to a head dissipation object. The electronic circuit can include a plurality of electronic components mounted to a printed circuit board having a thermally conductive substrate layer. The printed circuit board can be seated against at least one sidewall of the package, and can be secured to the heat dissipation object with one or more mounts. Each mount can comprise an opening via which the mount is fastenable to the heat dissipation object and an over-torque protection feature can connect between the opening and the sidewall. The over-torque protection feature can comprise at least one structural member that is a structurally weakest link between the opening and the sidewall for protecting the printed circuit board from excessive flexing during fastening. Particular embodiments of the method can further include certain details described above.

The present invention can also provide a method of mounting a printed circuit board to a surface with a housing, comprising engaging the printed circuit board with at least one sidewall of the housing. The housing can be formed of rigid plastic material, and one or more mounts can be integrally formed with the at least one sidewall extending generally perpendicularly therefrom in a cantilevered manner. Each mount can have an opening extending therethrough along an axis A that is generally parallel to the at least one sidewall. The mount can have a thickness dimension in the direction of axis A and have two spaced apart bars separated by a slot extending along said thickness dimension that connect the mount to the at least one sidewall. Each mount can be secured to the surface with a fastener extending within the opening along axis A. The two bars can be configured, shaped and sized to fail when a fastener that is being tightened exerts a force along axis A that reaches a predetermined threshold level of torque or force for protecting the printed circuit board from excessive flexing during fastening. Particular embodiments of the method can further include certain details described above.

Although none of the implementations is required to provide any specific advantage, some implementations may provide the advantage of inhibiting damaging stress to flex-sensitive components. Moreover, some implementations may provide that advantage without increasing the thickness of the PCB and thereby adding weight and cost. Further, some implementations secure the PCB to the heat dissipation feature more firmly than weak attachment clips that are designed to easily flex. Such clips may be impractical for implementations in which the electronic device will be subjected to motion and vibration. Further, some implementations are suitable for use with thermal pads and other materials that may be placed between the PCB and the heat dissipation feature. Such materials tend to increase the likelihood of damaging flexure of the PCB in the absence of over-torque protection features such as those described in this disclosure.

BRIEF DESCRIPTION OF THE DRAWINGS

The foregoing will be apparent from the following more particular description of example embodiments, as illustrated in the accompanying drawings in which like reference characters refer to the same parts throughout the different views. The drawings are not necessarily to scale, emphasis instead being placed upon illustrating embodiments.

DETAILED DESCRIPTION

A description of example embodiments follows.

FIGS. 1 through 4 illustrate an implementation of an electronics package with an over-torque protection feature that functions based on designed structural weakness. The over-torque protection feature, of which there may be multiple instances in the same package, helps to avoid excessive flexure of a PCB mounted in the package. The electronics package is secured to a heat dissipation object such as a heat sink with fasteners such as machine screws. The over-torque protection feature is designed to flex and/or structurally fail in response to excessive fastener tightening force, thereby protecting flex-susceptible components mounted on the PCB.

Figure 4:
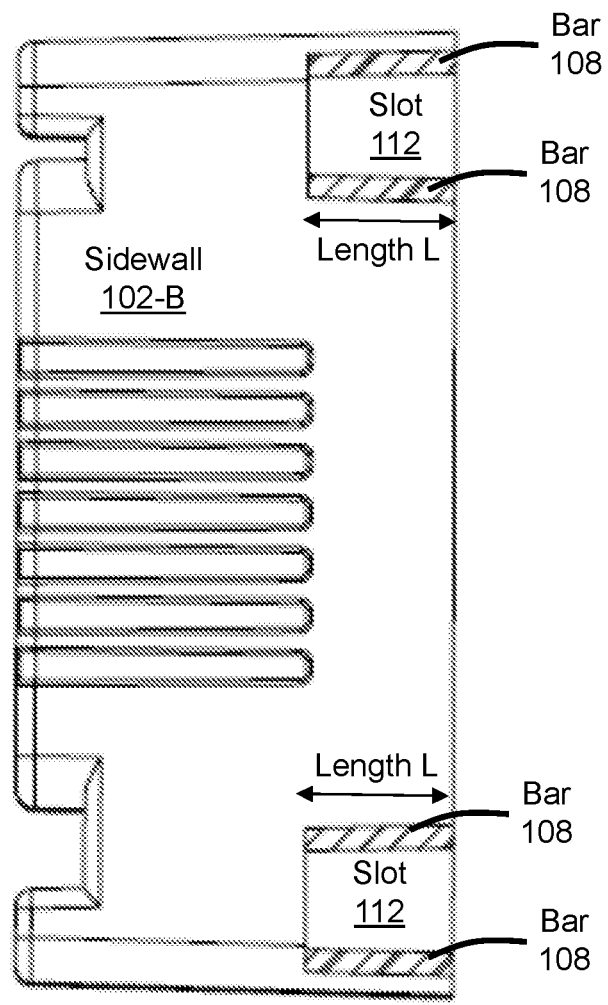
FIG. 4 illustrates section B-B of FIG. 3.
Figure 5:
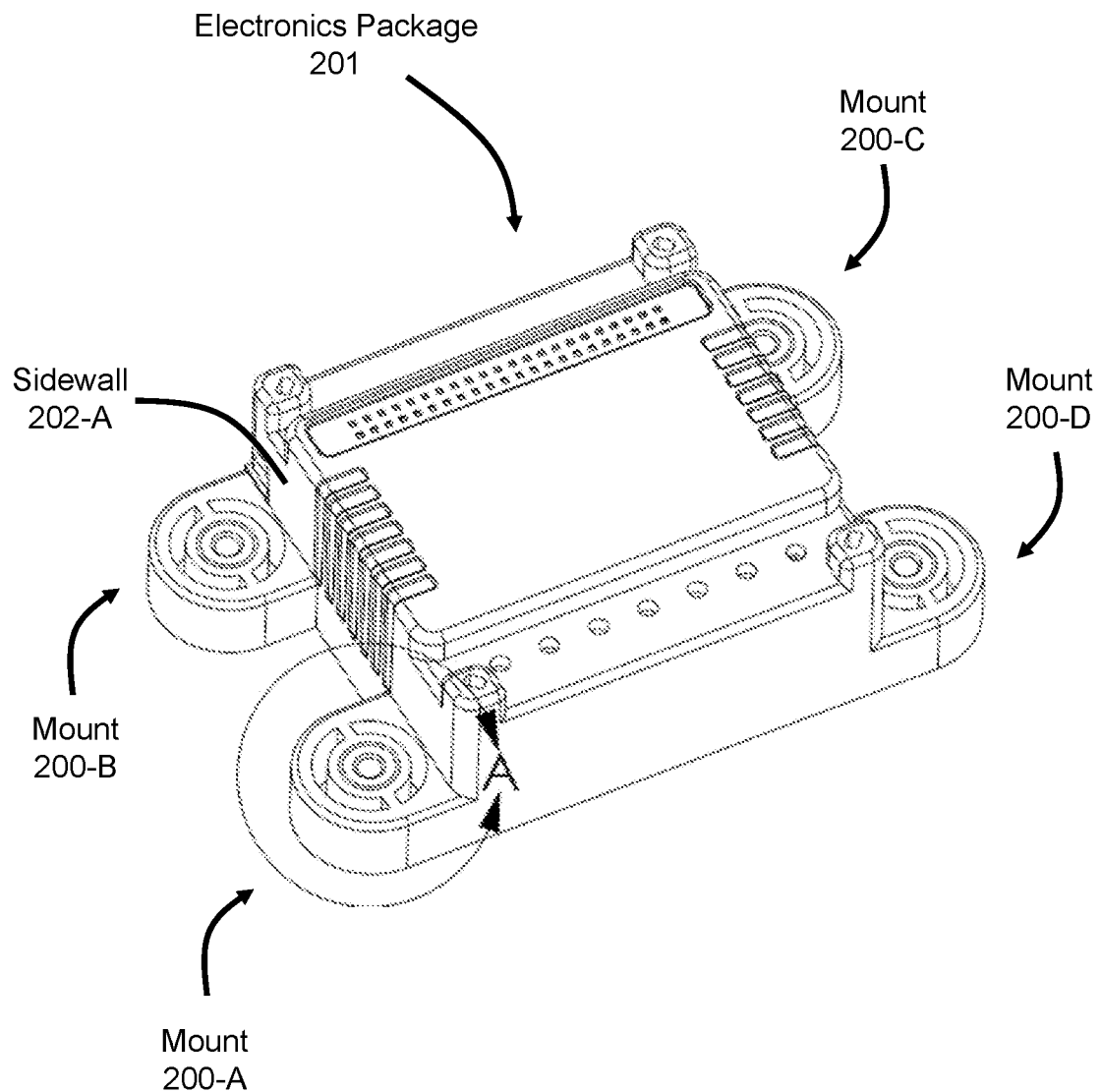
FIG. 5 illustrates an alternative implementation of an electronics package with an over-torque protection feature based on designed structural weakness.

The illustrated electronics package 101 has four sidewalls, including sidewall 102-A to which mount 100-A and mount 100-B are connected and can form a housing. Mounts 100-C and 100-D are connected to a parallel sidewall 102-B (FIG. 4). The electronics package 101 is secured to a heat-dissipation object such as a heat sink via the set of four mounts 100-A, 100-B, 100-C, 100-D. The mounts may be fewer or greater than four in number. As will be explained in greater detail below, the PCB may be mounted in the electronics package 101 such that an aluminum base layer forms a bottom wall of the packaged device. Moreover, the aluminum base layer may protrude from the package such that the sidewall edges and mounts do not contact the heat sink. This helps to avoid interference with thermal coupling of the aluminum base layer with the heat sink and presents an air gap between the mounts and the heat sink that facilitate structural failure at the designed fastener over-torque force because the mount is cantilevered from the sidewall rather than supported by the heat sink. The electronics package, including the mounts, may be molded, printed or machined as a single structure.

Instances of the over-torque protection feature are integrated into the mounts that are attached to the sidewalls. Each mount includes a distal end 104, which may be semi-cylindrical, and a rectangular cuboid body 106. A metallic threaded insert 110 may be disposed within the body 106 and distal end 104 to receive a fastener such as a machine screw for attaching the device to the heat sink. The threaded insert may traverse all or a portion of the thickness dimension T of the mount. The body is connected to one of the sidewalls via two spaced apart structural rectangular cuboid bars, arms, supports or members 108 (also referred to as rails). For example, mount 100-A connects to sidewall 102-A via two bars 108. The two bars are oriented with the longest surfaces in parallel, proximate to respective outer surfaces of the body 106. An empty rectangular cuboid recess, opening, hole, gap or slot 112 presents a void between the body 106, bars 108, and the sidewall. The bars 108, which are disposed between the threaded insert and the sidewall, present the mechanically weakest portion of the connection between the mount and the sidewall. The machine screw may apply force against the threaded insert 110 along an axis A that is parallel with the length dimension L of the bars 108 (The length L of the bars may be equal to the thickness T of the mount) and perpendicular to the width dimension W. Thus, a tension force component may be applied to the bars proportionate with the tightening force applied by the machine screw. Based on the properties of the material from which the bars are formed (e.g. strength and rigidity) and the dimensions of the bars, e.g. length L, thickness T, and width W, the connection between the mount and the sidewall may be designed to stretch and/or structurally fail at the bars in response to a predictable amount of tension force applied via tightening of a machine screw. For example, the bar dimensions and material may be selected such that the amount of force required to cause mechanical failure of the bars is greater than the force required to maintain a secure connection of the electronics package to the heat sink and less than the force that would cause an undesirable or unacceptable amount of flex of an aluminum PCB mounted in the electronics package. Consequently, over-torqueing of a fastener that connects the package to the heat sink will result in damage and/or failure of the bars of the corresponding mount rather than excessively flexing the PCB and causing damage to electronic components mounted thereon, thereby being a mechanical fuse.

It should be noted that the mount does not necessarily shear completely away from the sidewall when the bars fail due to over-torqueing of a fastener. For example, one or both bars may fracture along all or only a portion of their length but remain partially connected to or in contact with the sidewall. Further, the material from which the electronics package is manufactured may be selected such that failure of a bar results in an audible "snap" sound that alerts the installer that the fastener has been over-torqued, thereby prompting installation of a non-failed device or package. In some implementations a rigid material is used, and the bars fail without deformation in response to an over-torqued fastener. In some implementations the bars deform until the mount contacts the heatsink in response to an over-torqued fastener. In some implementations only a subset of the mounts includes an over-torque protection feature.

Figure 1:
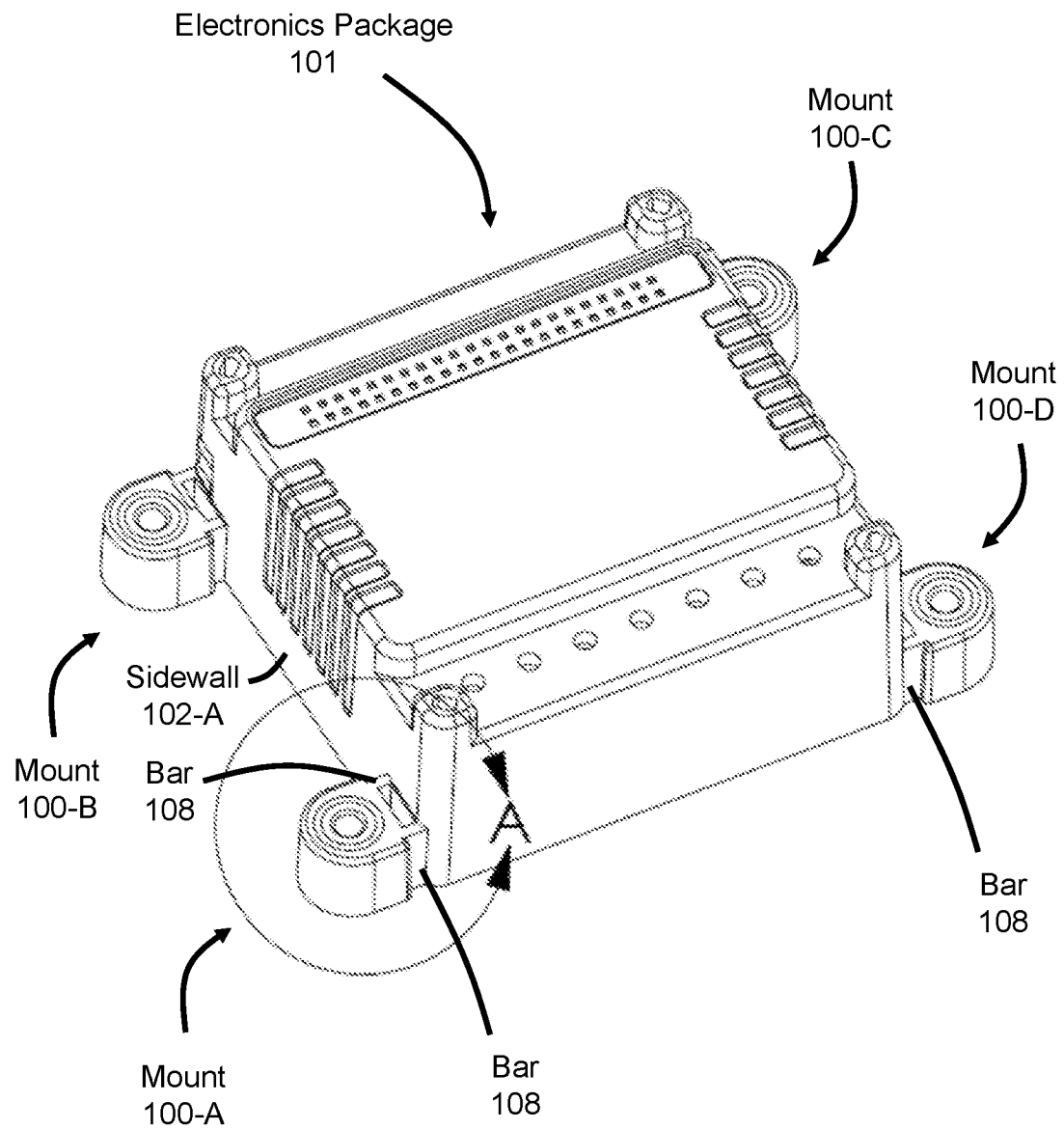
FIG. 1 illustrates an implementation of an electronics package with an over-torque protection feature based on designed structural weakness.
Figure 2:
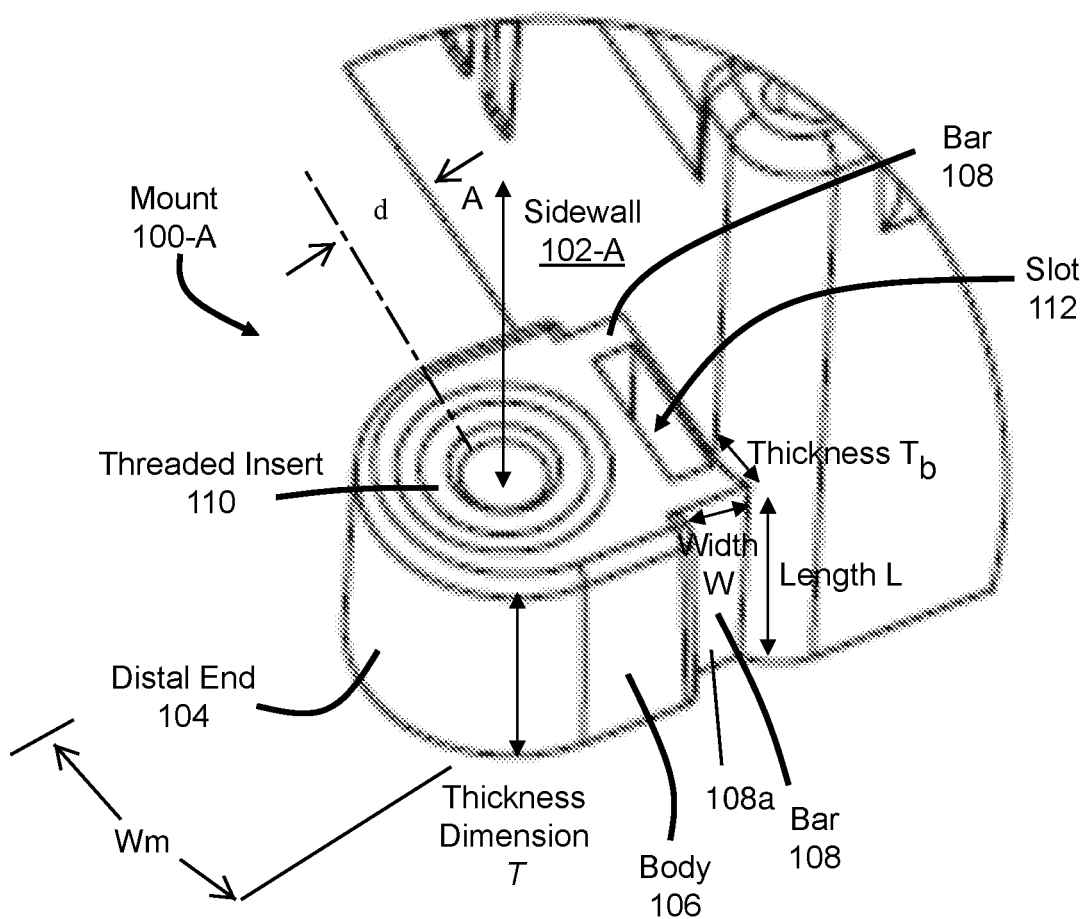
FIG. 2 illustrates detail A of FIG. 1 in greater detail.
Figure 3:
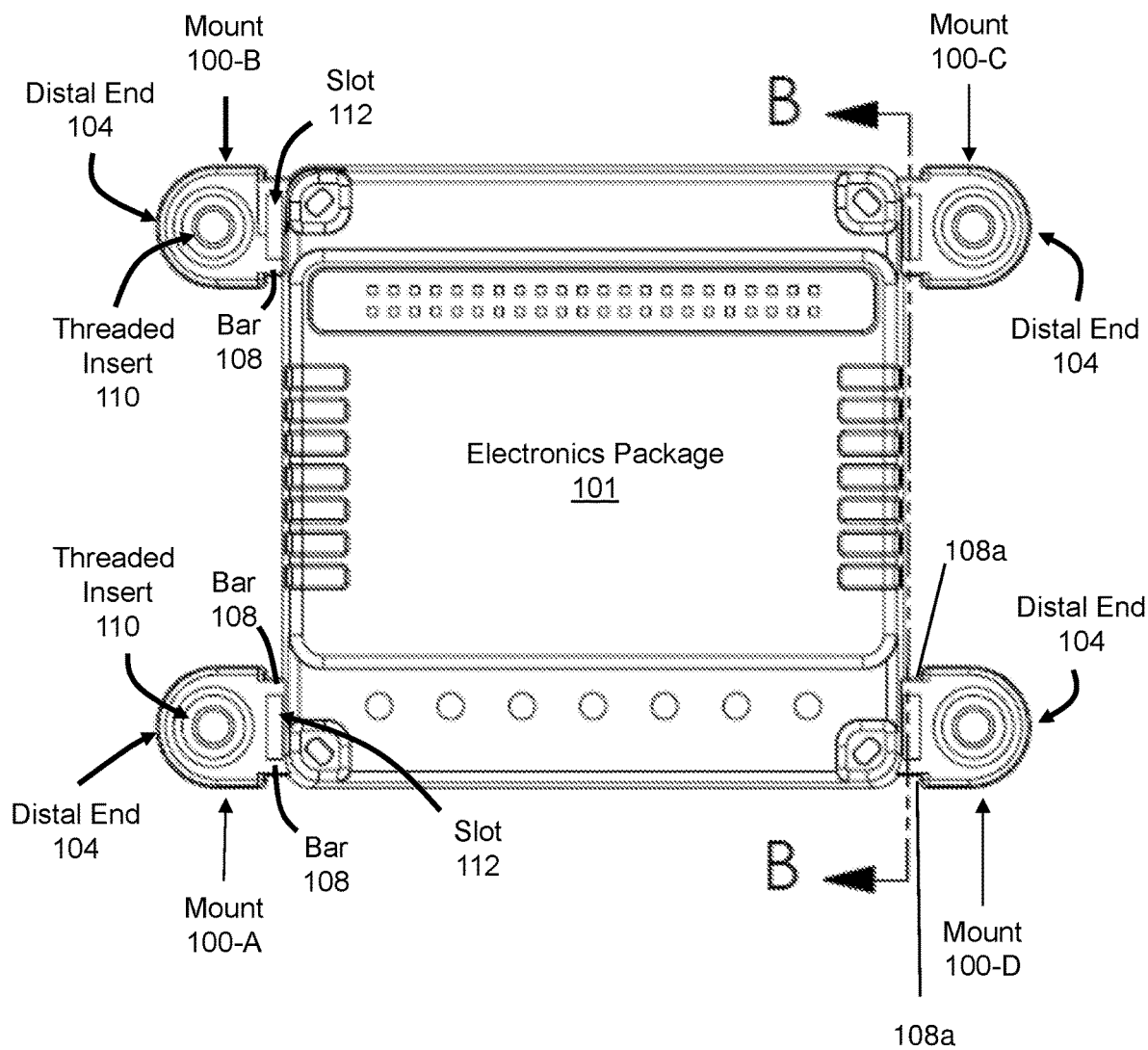
FIG. 3 is a plan view of the electronics package of FIG. 1.

In one embodiment, the housing of the electronics package 101 can be generally rectangular or square in shape with a hollow interior (FIGS. 1, 3 and 20), formed by four sidewalls 102-A and a top cover wall. The housing can be formed of a rigid plastic material such as 33% glass filled Polyphthalamide (PPA) in which the mounts 100-A through 100-D are integrally formed with the sidewalls 102-A. The housing can be about 1.5 by 1.5 inches square by about 0.7 inches high or thick, with a wall thickness of about 0.05 inches. The mounts can have a height or thickness dimension T of about ¼ inch or about 0.22-0.24 inches, for example about 0.23 inches, and a mount width $W_M$ of about 0.28-0.30 inches, such as 0.29 inches (FIG. 2). The two bars 108 can have a height or length L that is about the same as the height or thickness dimension T of the mounts. The bars 108 can each have a width W extending outwardly from the sidewall 102-A of about 0.05-0.08 inches, such as about 0.07 inches, and can each have a thickness $T_b$ of about 0.03-0.05 inches, such as about 0.04 inches. The outer lateral surfaces of the two bars 108 can be about 0.22-0.24 inches apart such as 0.23 inches, so as to form an indent, notch or groove 108a with the outer lateral surfaces of the mounts and the sidewalls 102-A, of about 0.02-0.03 inches. This can create a stress concentration location generally along a line parallel to axis A on the sides of the bars 108 to act as an over-torque mechanical fuse. The slot 112 between the bars 108, as well as the indents 108a, can reduce and weaken the connecting area of the mounts to the sidewall 102-A by about a ⅔ connecting area amount to provide a structurally weakened linkage, in comparison to a connecting area if the slot 112 and indents 108a were not formed in the mounts. The axis A can be centrally located within the mounts and can be located a distance d of about 0.15-0.17 inches or about 0.16 inches away from the sidewalls 102-A.

Figure 20:
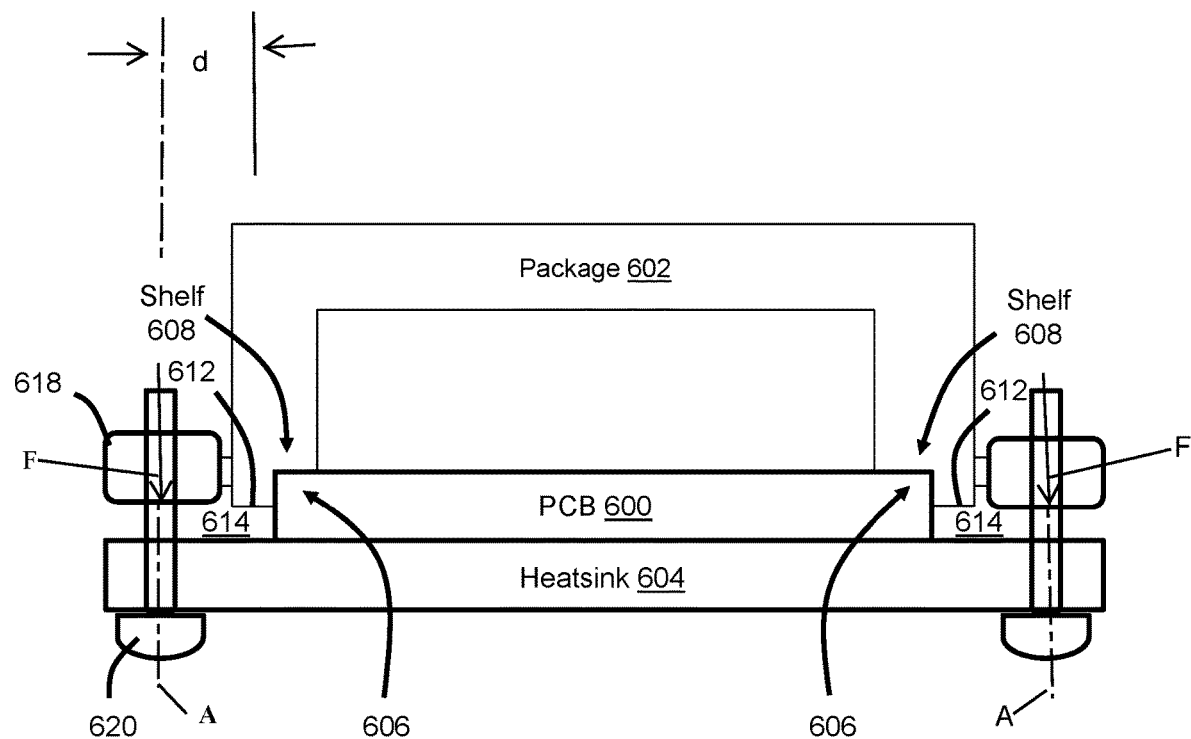
FIG. 20 illustrates the spatial relationship between the package, PCB and heatsink in greater detail.

Referring to FIG. 20, the package 101 can be generically shown as a package 602 having cantilevered mounts 618 extending from the sidewalls for securing a planar surface of a PCB 600 to a planar surface of a heatsink 604 with fasteners 620. The PCB 600 can sit within the shoulder or shelf 608 of package 602, and extend therefrom to form or define a space or air gap 614 between the mounts 618 of the package 602 from the surface of the heatsink 604. In one embodiment of package 101, the PCB can be about 1.4×1.4 inches by about 0.1 inches thick, and the air gap 614 between the surface of the heatsink 604 and the mounts can be about 0.02-0.03 inches. If the surfaces of the PCB 600 and/or the heatsink 604 are uneven, or if there is uneven foreign matter or particles therebetween, in the prior art, tightening the two surfaces together in compression typically requires more torque or force than normal, and can cause excessive flexing of the PCB 600 and damage to components thereon. However, the mounts in the present invention are configured to fail prior to causing excessive flexing. The mounts of package 101 are separated from the surface of the heatsink 604 by a large enough air gap 614, to be able to deflect or move a sufficient amount towards the heatsink 604 when subjected to a force F generated by a fastener 620 along axis A that reaches a predetermined threshold torque or force level while attempting to bring the surfaces of the PCB 600 and the heatsink 604 together, to be able to fail along one or both bars 108. The width W of the bars 108 that extends in the cantilevered direction can also be long enough to allow sufficient deflection and failure of the bars 108 within the air gap 614.

By having two bars 108 being separated by slot 112 and having indents 108a, the connection of the mounts to the sidewalls 102-A is weakened, in some embodiments by a ⅔ reduction in connecting area. However, by having a height or length L that is large in the direction parallel to axis A in comparison to the thickness $T_b$ that is small in the direction perpendicular to axis A, the bars 108 are configured to have a structural rigidity or stiffness to be stable in the direction of axis A while the fastener 620 extending along axis A is being tightened for clamping during normal assembly, until the predetermined threshold torque or force to break the bars 108 is reached. The two bars 108 are also laterally spaced a sufficient distance away from each other to have lateral or side to side rigidity under normal conditions. Since the force F directed along axis A is generated by gradually tightening the screw, force F can be considered to be a generally static force, in comparison to a dynamic force caused by impacts.

In one embodiment, the threaded insert 110 in the mounts can be a brass insert, and the fastener 620 or screw can be an M 2.5 screw (0.1 inch outer diameter). The minimum amount of torque on the fastener 620 to clamp the PCB to the heatsink can be about 1.8 inch pounds (in lbs), providing a clamp force F per mount along axis A of about 98 pounds (lbs), and a thermal interface pressure generated by four mounts between the surfaces of about 209 psi (lbs/in$^2$). The recommended fastener torque for clamping the surfaces together can be about 2.2 in lbs, providing a clamp force per mount of about 120 lbs, and a thermal interface pressure of about 255 lbs/in$^2$. One or both bars 108 can be configured to fail if the fastener 620 while being tightened, reaches a predetermined threshold torque level or amount of about 2.6 in lbs, providing about a predetermined threshold clamp force level of about 142 lbs, and about 302 lbs/in$^2$ thermal interface pressure. As a result, one or both of the bars 108 of one or more mounts can fail if the predetermined threshold torque or force level is reached to prevent unwanted excessive flexure or bending to the PCB 600.

In another embodiment, the fastener 620 can be an M 2 screw (0.08 inch outer diameter) which engages a threaded nut. In some embodiments, the minimum amount of torque on the fastener 620 to clamp the PCB to the heatsink can be about 1.3 inch lbs, providing a clamp force per mount along axis A of about 68 lbs, and a thermal interface pressure by four mounts of about 145 lbs/in$^2$. The recommended fastener torque can be about 1.6 in lbs, providing a clamp force per mount of about 85 lbs, and a thermal interface pressure of about 181 lbs/in$^2$. One or both bars 108 can be configured to fail if a fastener 620 while being tightened reaches a predetermined threshold torque level of about 1.9 in lbs, providing about a predetermined threshold clamp force level of about 102 lbs, and about 217 lbs/in$^2$ thermal interface pressure. As a result, one or both of bars 108 of one or more mounts can fail if the predetermined threshold torque or force level is reached to prevent unwanted excessive flexure to the PCB 600. Accordingly, in some embodiments, the bars 108 forming the mechanical fuse can be configured to fail when a predetermined threshold level of torque of about 1.5 to 3 in lbs is reached.

Figure 6:
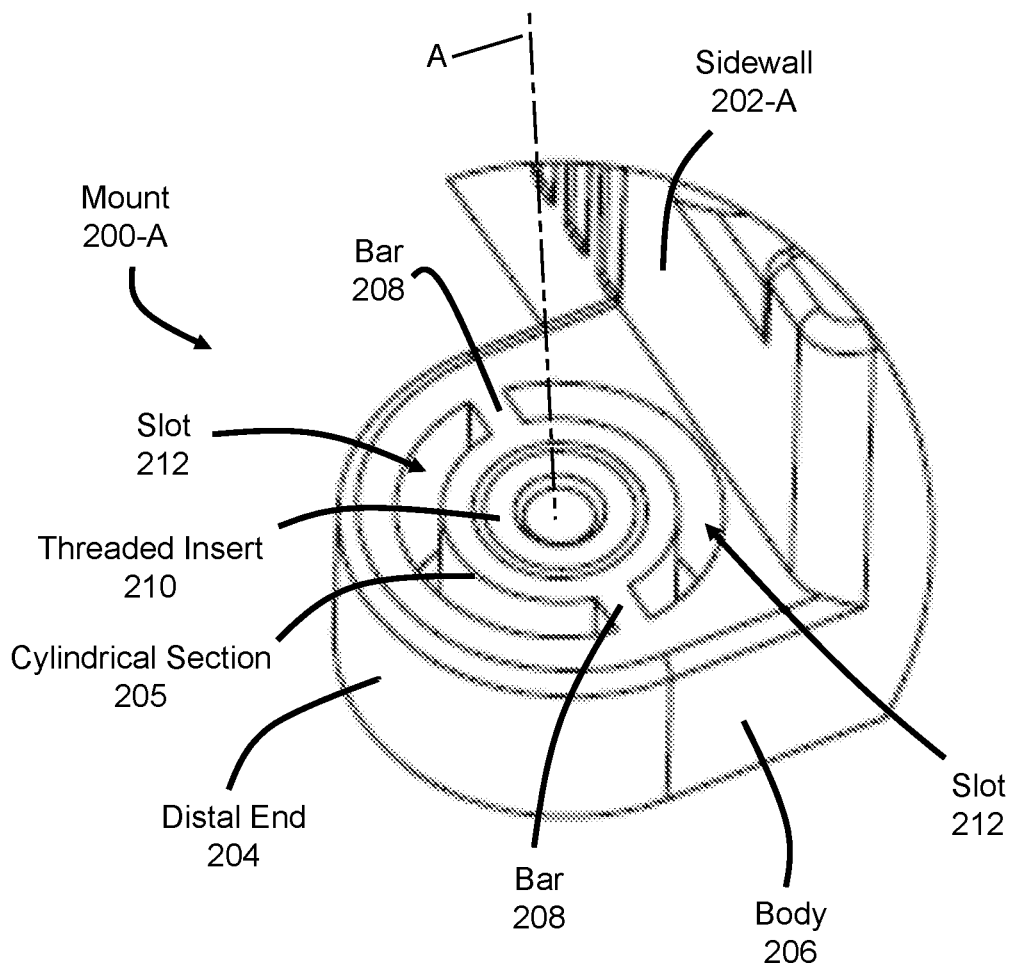
FIG. 6 illustrates detail A of FIG. 5 in greater detail.
Figure 7:
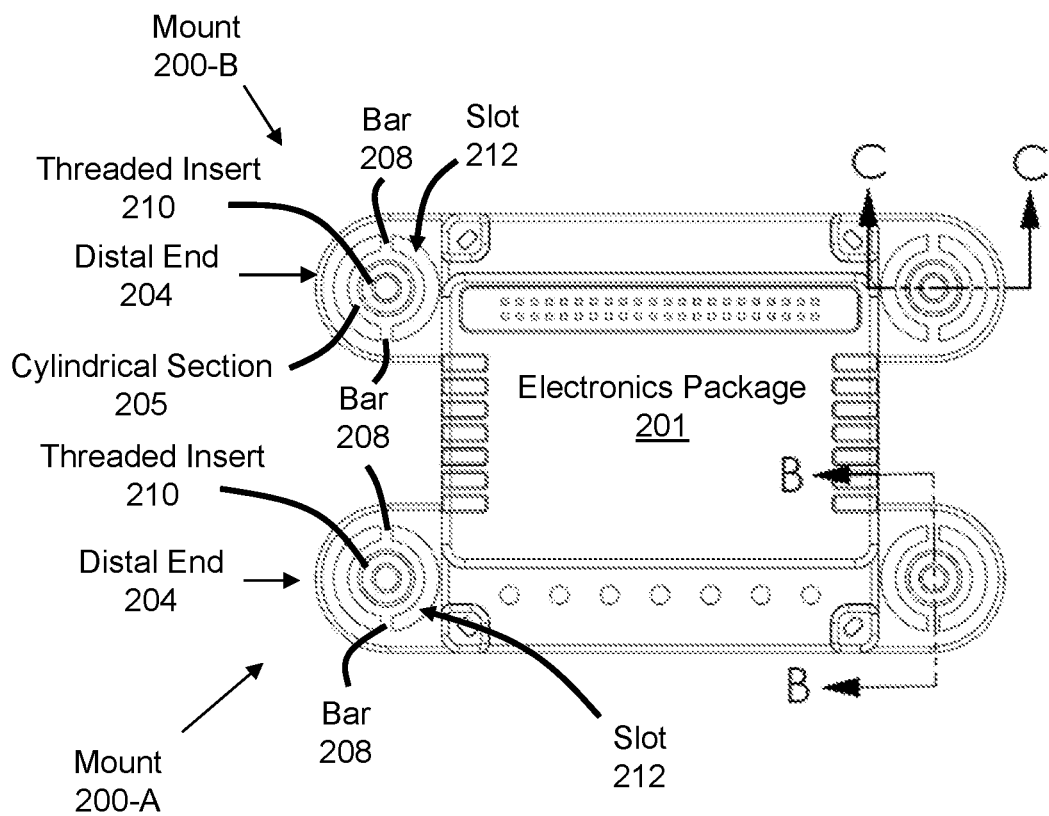
FIG. 7 is a plan view of the electronics package of FIG. 5.
Figure 8:
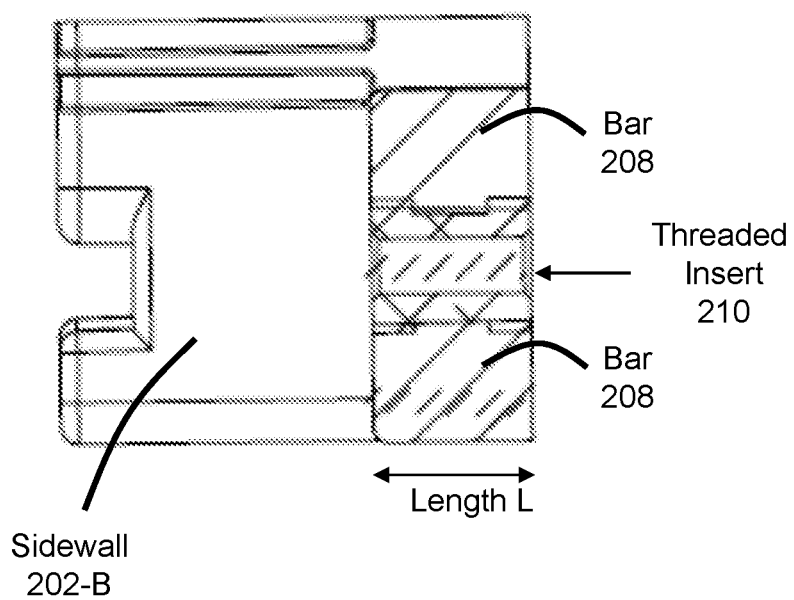
FIG. 8 illustrates section B-B of FIG. 7.
Figure 9:
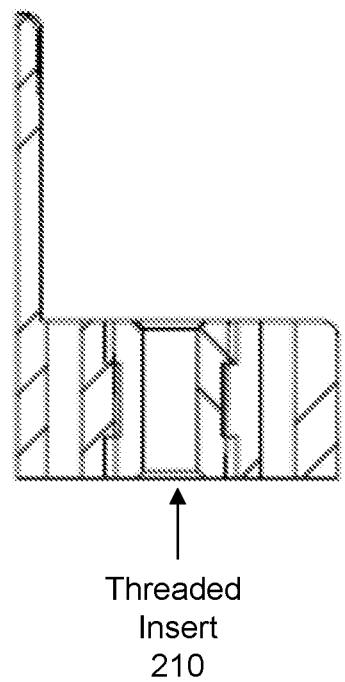
FIG. 9 illustrates section C-C of FIG. 7.
Figure 10:
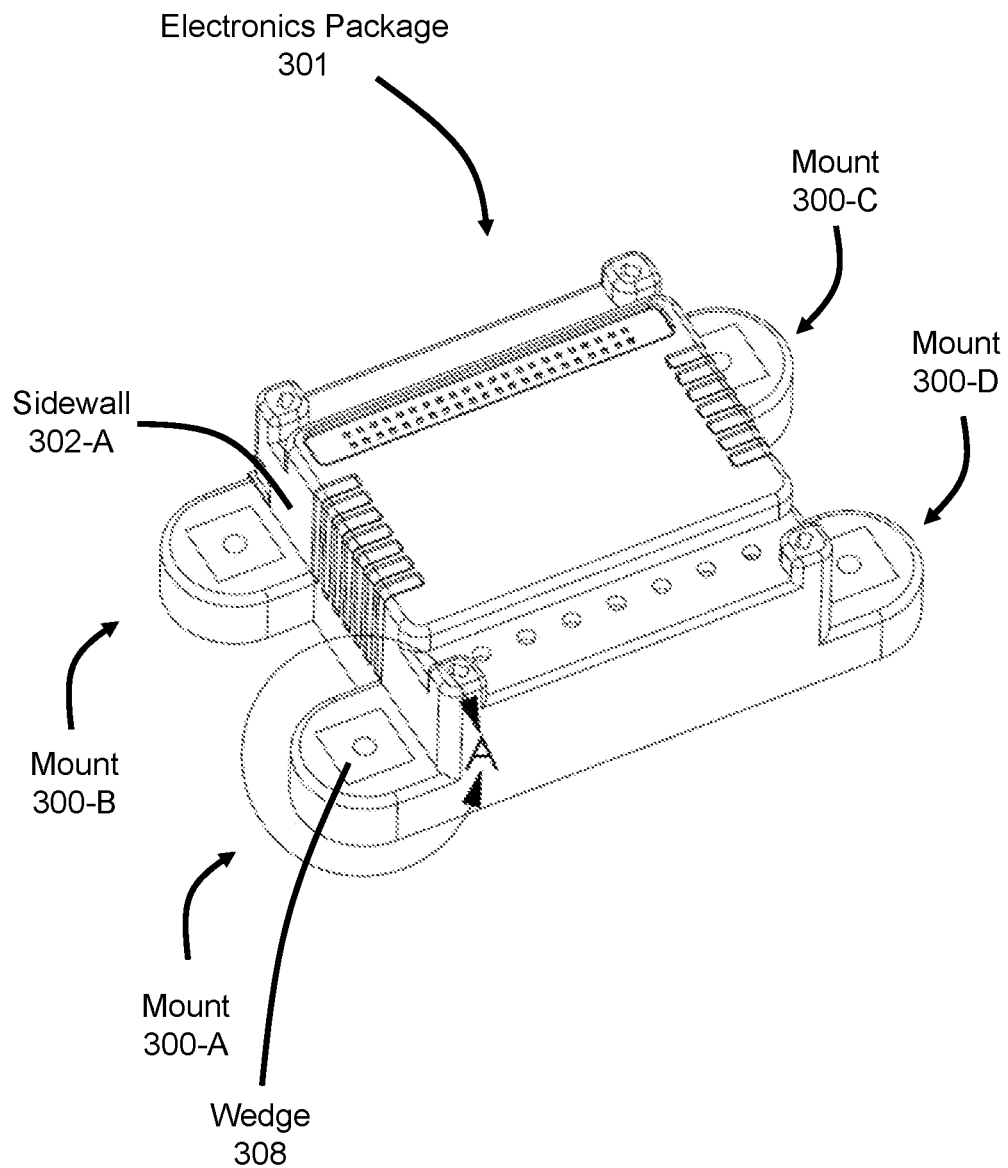
FIG. 10 illustrates another alternative implementation of an electronics package with an over-torque protection feature based on designed structural weakness.

FIGS. 5 through 9 illustrate an alternative implementation of an electronics package with an over-torque protection feature based on designed structural weakness. The illustrated electronics package 201 includes four mounts 200-A, 200-B, 200-C, 200-D and four sidewalls, including sidewall 202-A to which mount 200-A and mount 200-B are connected. Mounts 200-C and 200-D are connected to a parallel sidewall 202-B (FIG. 8). Each mount includes a semi-cylindrical distal end 204, a cylindrical section 205, and a rectangular cuboid body 206 that connects to one of the sidewalls, e.g. mount 200-A connected to sidewall 202-A as shown in FIG. 6. A metallic threaded insert 210 is fitted into the cylindrical section 205, which is connected to the body 206 via two rectangular cuboid bars 208 (also referred to as rails). The bars may be co-planar and disposed 180 degrees apart on the cylindrical section 205 that holds the threaded insert. Although the bars may be oriented in a wide variety of different ways, in the illustrated example two elongated flat surfaces of each bar are parallel to the adjacent sidewall.

The bars 208 present the mechanically weakest portion of the connection between the mount and the sidewall. The fasteners may apply force along an axis A that is parallel with the bar length dimension L. Based on the properties of the material from which the bars are formed and the dimensions of the bars, the connection between the mount and the sidewall may flex, deform, and/or fail at the bars in response to a predictable amount of force applied via a fastener when the package is mounted to another object. The bar dimensions and material may be selected such that the amount of force required to cause mechanical failure of the bars is greater than the force required to maintain a secure connection of the package to the object and less than the force that would cause an undesirable amount of flex of an aluminum PCB mounted in the package. The predetermined threshold torque or force level chosen can be similar to that described for package 101. Consequently, over-torqueing of a fastener that connects the package to the object will result in deformation and/or failure of the bars of the corresponding mount rather than excessively flexing the PCB and causing damage to the components mounted thereon. The cylindrical section does not necessarily shear completely away from the body when a bar fails due to over-torqueing of a fastener. For example, one or both bars may fracture along all or only a portion of their length but remain partially connected to or in contact with the body. The material from which the package is manufactured may be selected such that failure of a bar results in an audible sound that alerts the installer that the fastener has been over-torqued and prompts installation of a non-failed device or package.

Figure 11:
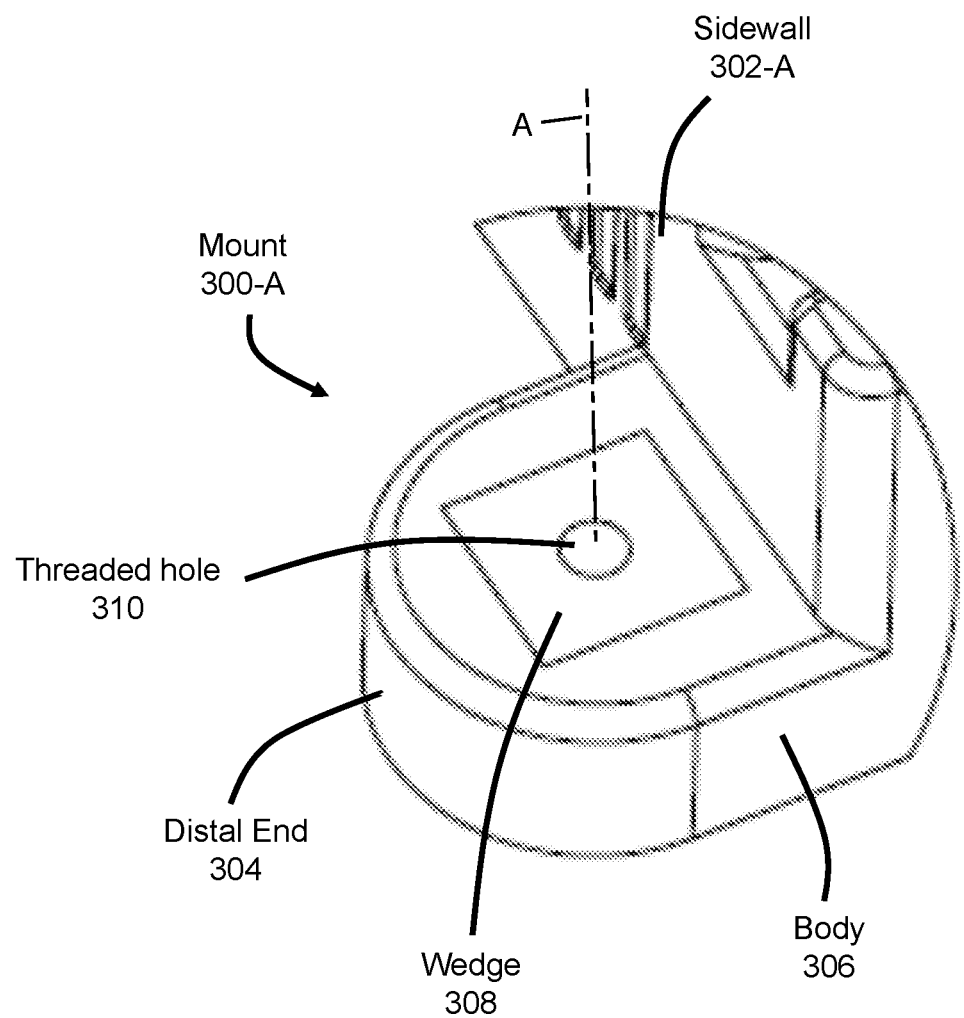
FIG. 11 illustrates detail A of FIG. 10 in greater detail.
Figure 12:
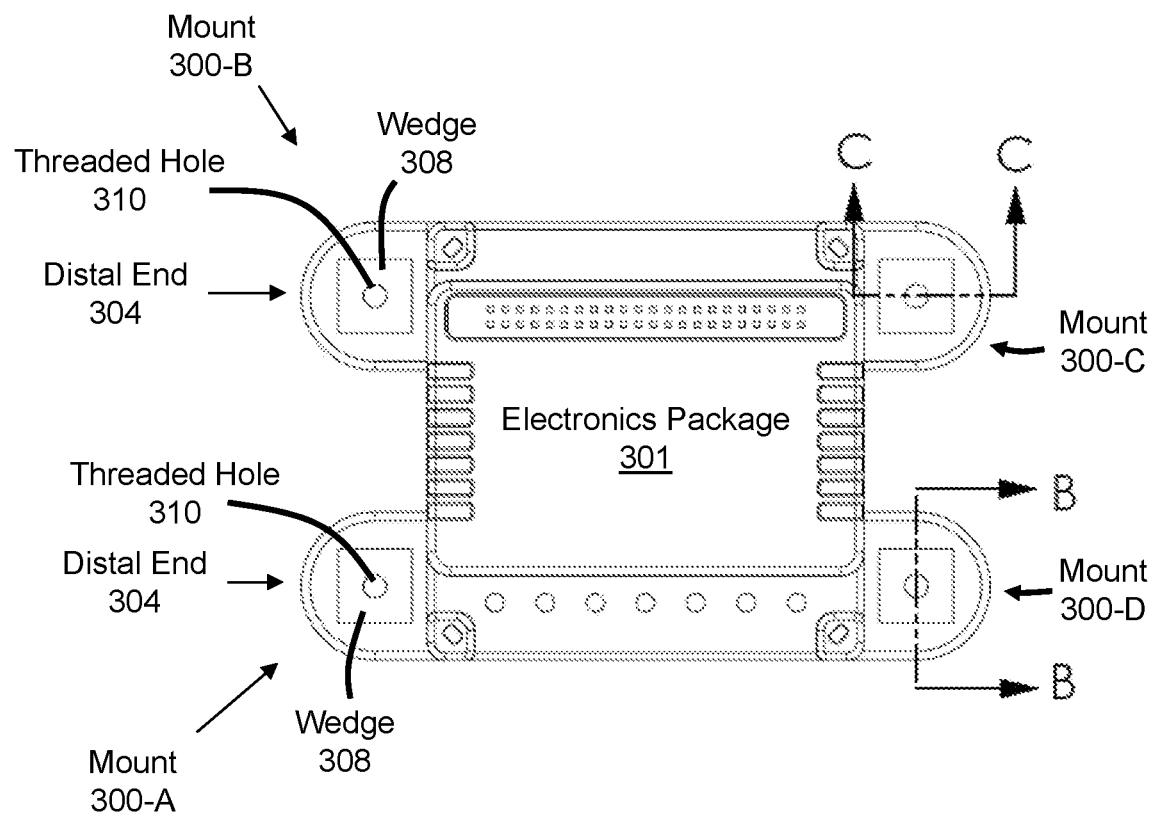
FIG. 12 is a plan view of the electronics package of FIG. 10.
Figure 13:
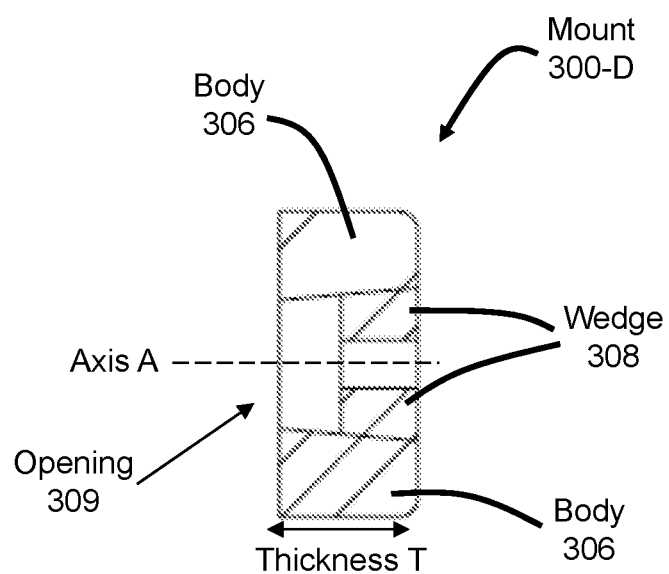
FIG. 13 illustrates section B-B of FIG. 12.
Figure 14:
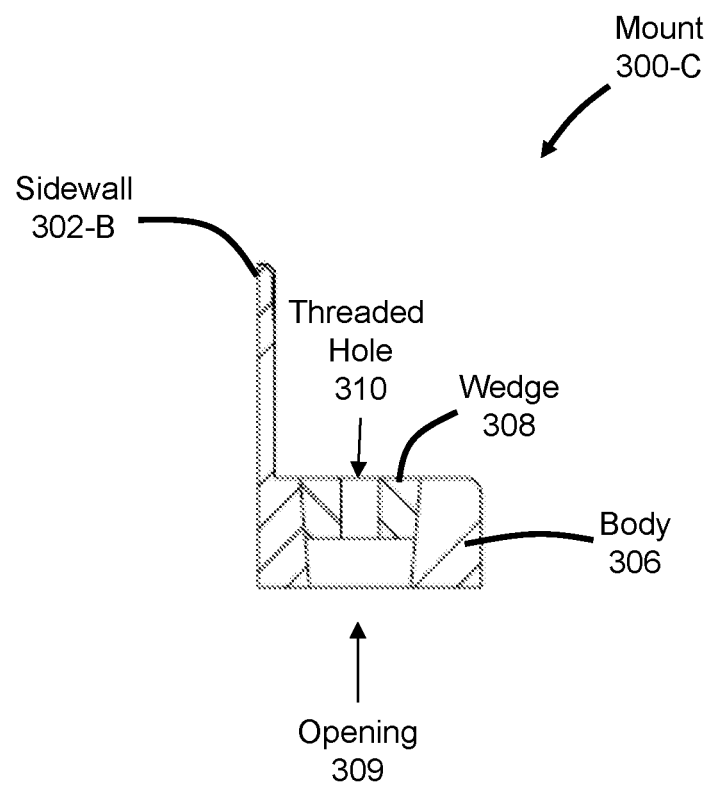
FIG. 14 illustrates section C-C of FIG. 12.
Figure 15:
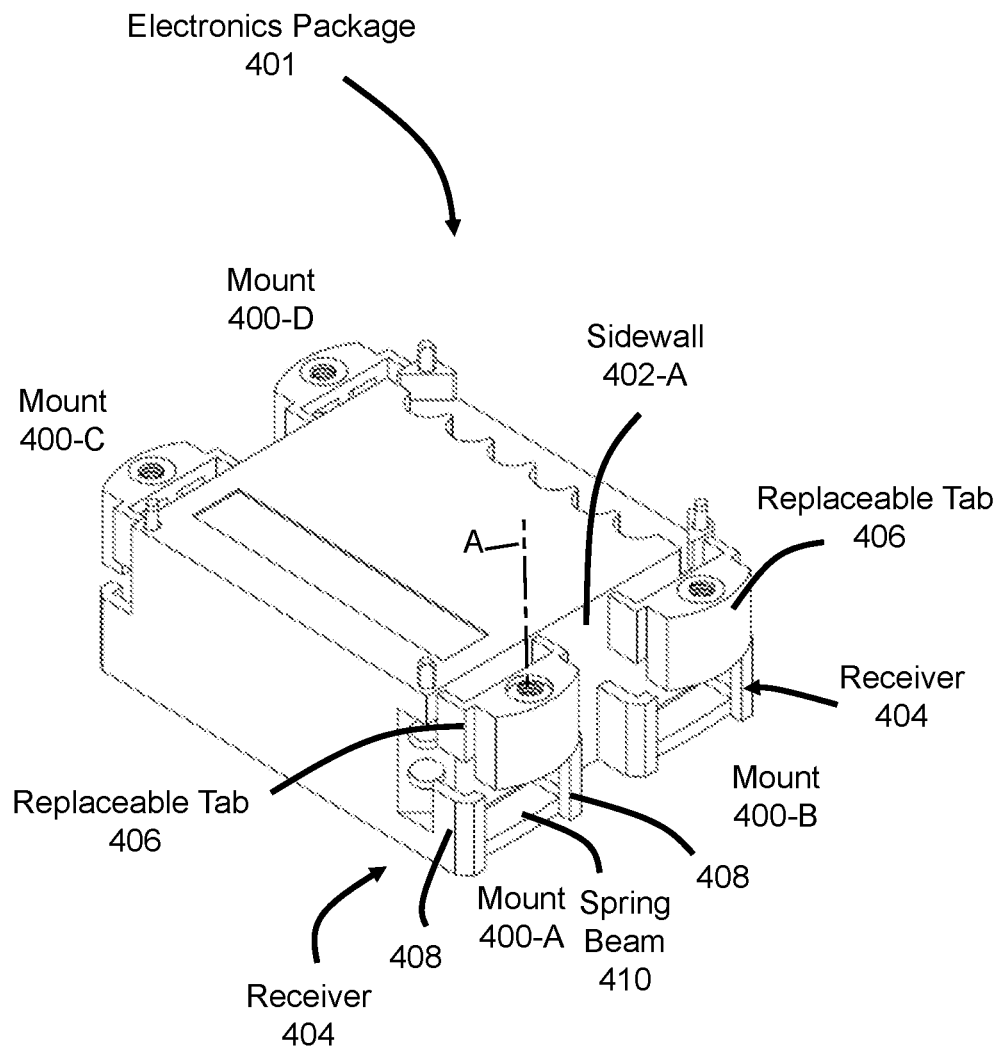
FIG. 15 illustrates an alternative implementation of an electronics package with an over-torque protection feature that helps to avoid excessive flexure of a PCB mounted therein.
Figure 16:
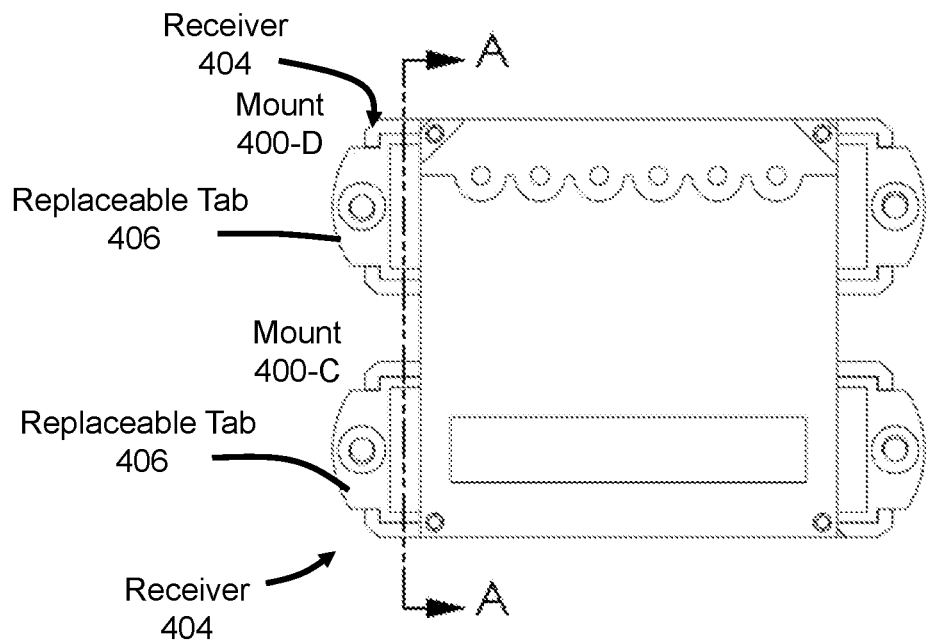
FIG. 16 is a plan view of the electronics package of FIG. 15.
Figure 17:
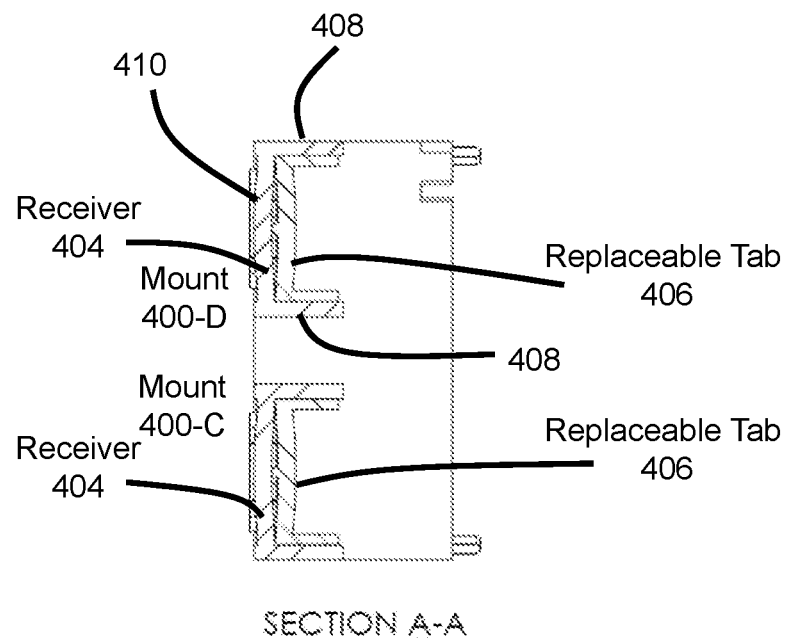
FIG. 17 illustrates section A-A of FIG. 16.
Figure 18:
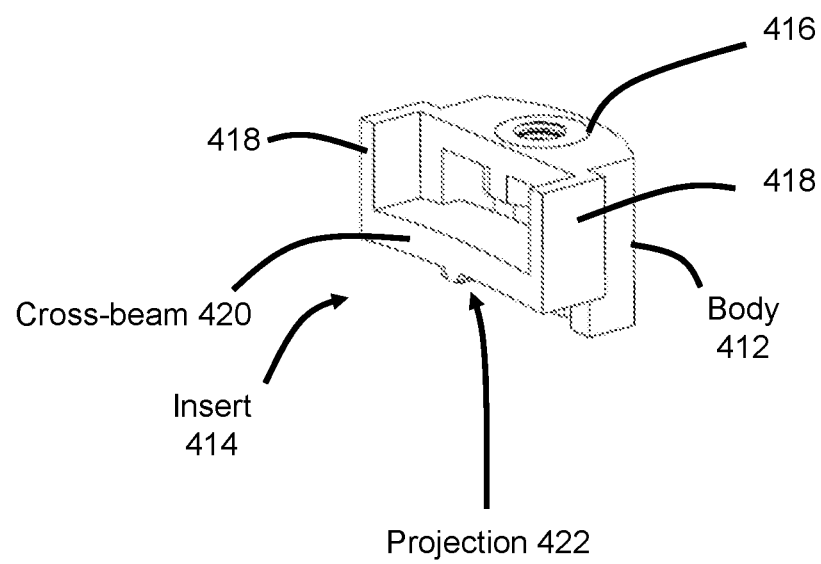
FIG. 18 illustrates the removable tab of FIG. 15 in greater detail.

FIGS. 10 through 14 illustrate another alternative implementation of an electronics package with an over-torque protection feature based on designed structural weakness. The illustrated electronics package 301 includes four mounts 300-A, 300-B, 300-C, 300-D and four sidewalls, including sidewall 302-A (FIG. 10) to which mount 300-A and mount 300-B are connected. Mounts 300-C and 300-D are connected to a parallel sidewall 302-B (FIG. 14). Each mount includes a semi-cylindrical distal end 304 and a rectangular cuboid body 306 that connects to one of the sidewalls, e.g. mount 300-A connected to sidewall 302-A as shown in FIG. 11. A truncated polyhedron-shaped or conical wedge 308 is fitted into a correspondingly-shaped opening 309 (FIGS. 13 and 14) that extends through the body 206. For example, the wedge may be disposed in the opening with a friction fit or press fit. Further resistance to moving of the wedge 308 within the opening 309 may be determined by the angular orientation of the surfaces of the wedge that contact the body 306 and frictional properties of the materials and contact surfaces. Steeper angles may present less resistance to movement than shallow angles. The wedge 308 includes a threaded hole 310 for receiving the fastener.

The connection between the wedge 308 and the body presents the mechanically weakest portion of the connection between the mount and the sidewall. The fastener may apply force along an axis A that is parallel with the wedge thickness dimension T. Based on the resistance presented between the wedge and the body, the connection between the mount and the sidewall may partially or completely fail at the wedge in response to a predictable amount of force applied via a fastener when the package is mounted to another object. For example, the wedge may be pulled further into or through the opening in response to over-torqueing of the fastener and can cause portions of the mount surrounding the opening 309 that holds or contains the wedge 308 to break or fail. The wedge and opening dimensions, geometry and material may be selected such that the amount of force required to cause mechanical failure of the wedge-to-body connection is greater than the force required to maintain a secure connection of the package to the object and less than the force that would cause an undesirable amount of flex of an aluminum PCB mounted in the package. In one embodiment, the sides of the wedge 308 such as seen in FIG. 13 can each be angled relative to axis A by about 5 degrees for creating mechanical advantage or leverage to cause breakage. The predetermined torque or force level chosen can be similar to that described for package 101. Consequently, over-torqueing of a fastener that connects the package to the object will result in failure of the mount at the wedge rather than excessively flexing the PCB and causing damage to the components mounted thereon.

FIGS. 15 through 18 illustrate an alternative implementation of an electronics package with an over-torque protection feature. The illustrated electronics package 401 includes four mounts 400-A, 400-B, 400-C, 400-D and four sidewalls, including sidewall 402-A to which mount 400-A and mount 400-B are connected. Mounts 400-C and 400-D are connected to a parallel sidewall. Each mount includes a receiver 404 and a removable tab 406. Each receiver 404 includes two parallel vertical members 408 and an interconnecting spring beam 410. Distal ends of the spring beam are connected to the vertical members. A gap is presented between the spring beam and the sidewall such that the spring beam is solely supported by the connections to the vertical members at distal ends, and thus flexes in response to force. Each vertical member includes a first portion that is connected to the sidewall and a second portion that is angled relative to the first portion to form a slot into which a removable tab is inserted, seated and retained. More particularly, the receiver only allows the removable tab mounted therein to slide in one dimension, with range of travel limited in one direction by the spring beam. Each removable tab 406 includes a body 412 and an insert 414. The body includes a threaded insert 416 for receiving a fastener. The insert includes two parallel vertical bars 418 that are interconnected by a cross-beam 420. The vertical bars extend beyond the body. The cross-beam includes a projection 422. A removable tab 406 is mounted in a receiver 404 such that the vertical bars 418 are retained by the vertical members 408 of the receiver. The tab is inserted into the receiver until the projection 422 contacts the spring beam 410. The spring beam and cross-beam flex in response to excessive fastener tightening force, thereby inhibiting flexure of the PCB from over-torqueing of the fastener. In some implementations the spring beam may fail in response to over-torqueing of the fastener. The flexing or failure of the beams can be selected to occur at a predetermined threshold torque or force level similar to that in package 101.

Figure 19:
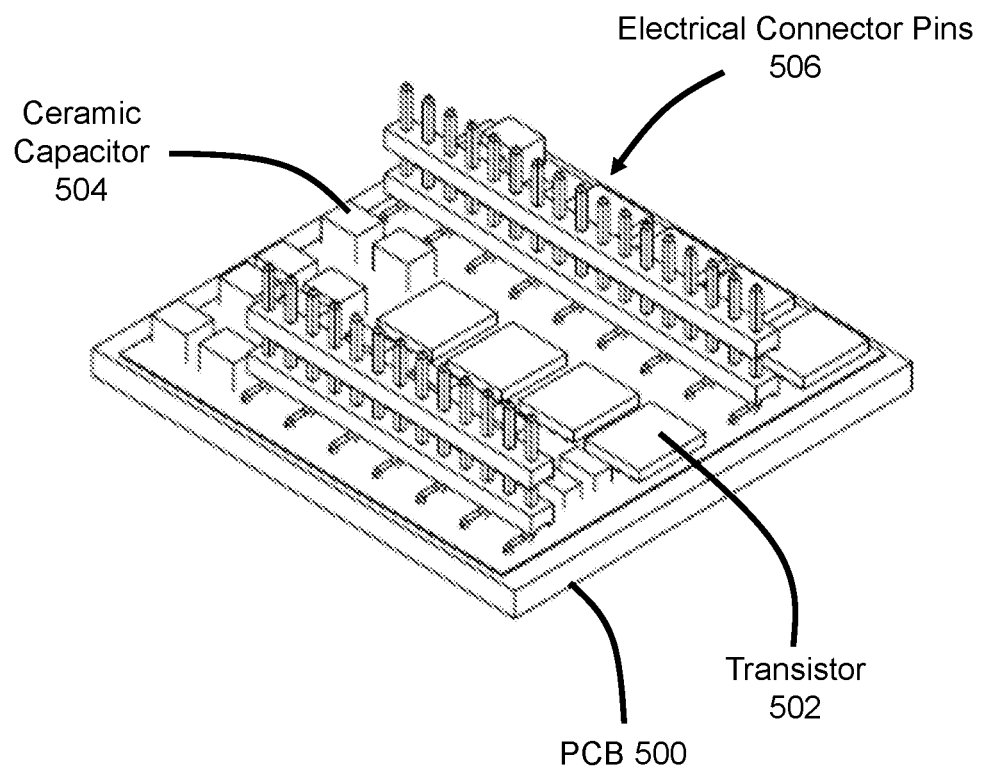
FIG. 19 illustrates an example of a populated PCB suitable for use with the packages disclosed herein.

FIG. 19 illustrates an implementation of a power card on an aluminum PCB 500. The illustrated example is part of a digital drive. An amplifier circuit includes electronic components that are mounted on the PCB 500. The electronic components may include transistors 502 (e.g. and without limitation MOSFETs) and ceramic capacitors 504. Some or all the electronic components may be surface-mounted. The transistors 502 generate significant amounts of heat that must be transferred away from the amplifier circuit to avoid heat-related damage. The ceramic capacitors 504 are more susceptible to damage from PCB flexure than the other components. Electrical connector pins 506 are used to electrically interconnect the amplifier circuit with a control circuit. The various packages described above can be used to house the PCB, secure the PCB to a heat dissipation feature, and reduce the likelihood of damage to the ceramic capacitors by inhibiting flexure of the PCB if the fasteners are over-torqued.

FIG. 20 illustrates the spatial relationship between a mounted PCB 600, electronics package 602 and heatsink 604 in greater detail. The package and PCB may include any of the implementations described above. Outer edges 606 of the PCB are seated against a shelf 608 formed along edges of each sidewall of the package 602. The PCB 600, and specifically the aluminum substrate, extends beyond a distal edge 612 of the sidewall such that the package 602 does not inhibit contact, and thus thermal coupling, between an outer surface of the PCB 600 and the heatsink 604. An air gap 614 is presented between the distal edge 612 and the heatsink 604. The mounts 618 are flush with the distal edges of the sidewall, so the air gap 614 is also presented between the mounts 618 and the heatsink 604. Consequently, the mounts 618 are cantilevered from the sidewalls and can be pulled toward the heatsink in response to over-torqueing of the fastener 620, thereby triggering the over-torque protection feature.

Figure 21:
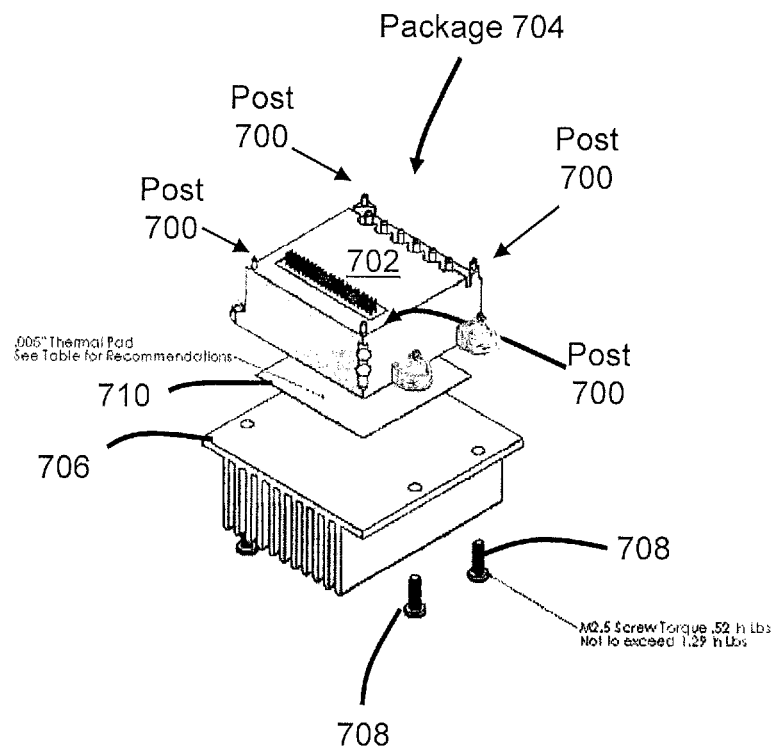
FIG. 21 illustrates solderable mounting posts for connecting the package to a control circuit.

Referring to FIG. 21, four solderable mounting posts 700, one at each corner of a top wall 702 of the package 704, enable the device to be securely mechanically connected to a control circuit. For example, the mounting posts may be soldered into through-holes formed in the control circuit. The mounting posts may be integral to the housing, e.g., partially enclosed by the top wall and/or sidewalls and held in place by a friction fit or inserted during the manufacture of the housing. The mounting posts help to isolate the electrical connector pins 506 (FIG. 19) from the mechanical stresses to which the housing is subjected, e.g. stresses caused by vibration and inertial forces resulting from changes in velocity and direction. Mechanical stress created by changes in velocity and direction of the heatsink 706 is transferred from the heatsink to the control circuit via the housing, thereby protecting the integrity of the electrical connection between the digital drive and the control circuit. As shown in the example, fasteners 708 may be inserted through openings in the heatsink and mated to threaded openings in the mounts. Further, a thermal pad 710 may be disposed between contact surfaces of the PCB and heatsink.

In the illustrated examples there are two pairs of mounting tabs formed at distal ends of two opposing sidewalls. However, any number of mounting projections could be implemented on any number of sidewalls. Moreover, the openings are not necessarily threaded. For example, the head of the fastener could be seated against the mounting tab and the threaded shank could be inserted into a threaded opening in the heatsink or held in place by a threaded nut.

While example embodiments have been particularly shown and described, it will be understood by those skilled in the art that various changes in form and details may be made therein without departing from the scope of the embodiments encompassed by the appended claims. It will be understood that a wide variety of modifications and combinations may be made without departing from the scope of the inventive concepts described herein. Features of the various embodiments can be combined together or omitted.

What is claimed is:

1. An electronic device comprising:
an electronic circuit comprising one or more electronic components mounted to a printed circuit board comprising a thermally conductive substrate layer; and
a package against which the printed circuit board is seated, the package comprising at least one sidewall and one or more mounts via which the electronic device is secured to a heat dissipation object, each mount comprising an opening via which the mount is fastenable to the heat dissipation object and an over-torque protection feature connected between the opening and the sidewall, wherein structural failure of the over-torque protection feature creates an audible noise.

2. The electronic device of claim 1 wherein the over-torque protection feature comprises at least one structural member that is a structurally weakest link between the opening and the sidewall.

3. The electronic device of claim 2 wherein the over-torque protection feature comprises at least one rectangular cuboid bar that interconnects a body of the mount with the sidewall.

4. The electronic device of claim 3 wherein the over-torque protection feature comprises first and second rectangular cuboid bars with a void therebetween.

5. The electronic device of claim 4 wherein the rectangular cuboid bars are oriented with longest surfaces in a first axis that is parallel to an axis defined by a length dimension of a first fastener in the threaded opening.

6. The electronic device of claim 2 wherein the opening is disposed in a cylindrical section and the over-torque protection feature comprises first and second rectangular cuboid bars that connect the cylindrical section to a body of the mount.

7. The electronic device of claim 6 wherein the first and second rectangular cuboid bars are offset by 180 degrees relative to the opening.

8. The electronic device of claim 2 wherein the opening is disposed in a wedge section and the over-torque protection feature comprises the wedge and a correspondingly-shaped opening in a body of the mount.

9. The electronic device of claim 8 wherein the wedge has a truncated polyhedron shape.

10. The electronic device of claim 2 wherein the over-torque protection feature comprises a receiver and a removable tab.

11. The electronic device of claim 10 wherein the receiver comprises a spring beam and the removable tab comprises a cross-beam with a projection that contacts the spring beam.

12. The electronic device of claim 1 wherein the mount is fastenable to the heat dissipation object with a machine screw.

13. The electronic device of claim 1 wherein the thermally conductive substrate layer forms an end-wall of the electronic device.

14. The electronic device of claim 1 wherein an air gap is present between the mount and the heat dissipation object.

15. The apparatus of claim 1 wherein the package comprises solderable mounting posts.

16. The electronic device of claim 1 in which each mount of the package is securable to the heat dissipation object by a fastener extending within the opening of the mount along an axis A, each mount having a configuration that allows the package to be tightened by the fastener to the heat dissipation object securely under normal assembly conditions, but also providing a readily apparent mechanical indication of over-torque or force applied to the fastener along the axis A when a predetermined threshold torque or force level is reached while tightening the fastener for preventing the fastener from being tightened above the predetermined threshold torque force or level.

17. The electronic device of claim 1 in which each mount is configured to be generally stable during tightening with a fastener extending along an axis A until reaching a predetermined threshold torque or force level at which at least a portion of the mount undergoes a mechanical alteration.

18. The electronic device of claim 17 in which the mechanical alteration is at least one of deformation, deflection, breakage, failure and movement.

19. A package for an electronic circuit including one or more electronic components mounted to a printed circuit board including a thermally conductive substrate layer, comprising:
at least one sidewall against which the printed circuit board is seated and one or more mounts via which the printed circuit board is secured to a heat dissipation object, each mount comprising an opening via which the mount is fastenable to the heat dissipation object and an over-torque protection feature connected between the opening and the sidewall, the over-torque protection feature comprising at least one structural member that is a structurally weakest link between the opening and the sidewall, wherein structural failure of the over-torque protection feature creates an audible noise.

20. The package of claim 19 wherein the over-torque protection feature comprises first and second rectangular cuboid bars with a void therebetween.

21. The package of claim 19 wherein the opening is disposed in a cylindrical section and the over-torque protection feature comprises first and second rectangular cuboid bars that connect the cylindrical section to a body of the mount.

22. The package of claim 19 wherein the opening is disposed in a wedge section and the over-torque protection feature comprises the wedge and a correspondingly-shaped opening in a body of the mount.

23. The package of claim 19 in which each mount of the package is securable to the heat dissipation object by a fastener extending within the opening of the mount along an axis A, each mount having a configuration that allows the package to be tightened by the fastener to the heat dissipation object securely under normal assembly conditions, but also providing a readily apparent mechanical indication of over-torque or force applied to the fastener along the axis A when a predetermined threshold torque or force level is reached while tightening the fastener for preventing the fastener from being tightened over the predetermined threshold torque or force level.

24. The package of claim 19 in which each mount is configured to be generally stable during tightening with a fastener extending along an axis A until reaching a predetermined threshold torque or force level at which at least a portion of the mount undergoes a mechanical alteration.

25. The package of claim 24 in which the mechanical alteration is at least one of deformation, deflection, breakage, failure and movement.

26. A housing for mounting a printed circuit board to a surface comprising:
at least one sidewall for engaging the printed circuit board, the housing being formed of a rigid plastic material; and
one or more mounts integrally formed with the at least one sidewall extending generally perpendicular therefrom in a cantilevered manner, each mount having an opening extending therethrough along an axis A that is generally parallel to the at least one sidewall for allowing the mount to be secured to the surface with a fastener, the mount having a thickness dimension in the direction of axis A and having two spaced apart bars separated by slot extending along said thickness dimension that connect the mount to the at least one sidewall, the two bars being configured, shaped and sized to fail when a fastener that is being tightened exerts a force along axis A that reaches a predetermined threshold level of torque or force for protecting the printed circuit board from excessive flexing during fastening.

27. The housing of claim 26 in which the two bars are each recessed relative to lateral sides of the mount to form a stress concentration line on the bars along said thickness dimension parallel to axis A.

28. The housing of claim 26 in which the predetermined threshold torque level is about 1.5 to 3 in lbs.

29. A method of securing an electronic device to a heat dissipation object comprising:
providing an electronic circuit comprising one or more electronic components mounted to a printed circuit board comprising a thermally conductive substrate layer;
seating the printed circuit board against a package, the package comprising at least one sidewall and one or more mounts; and
securing the electronic device to the heat dissipation object, each mount comprising an opening via which the mount is fastenable to the heat dissipation object and an over-torque protection feature connected between the opening and the sidewall for protecting the printed circuit board from excessive flexing during fastening, wherein structural failure of the over-torque protection feature creates an audible noise.

30. A method of securing a package for an electronic circuit including a plurality of electronic components mounted to a printed circuit board including a thermally conductive substrate layer, to a heat dissipation object, comprising:
seating the printed circuit board against at least one sidewall of the package: and
securing the printed circuit board to the heat dissipation object with one or more mounts, each mount comprising an opening via which the mount is fastenable to the heat dissipation object and an over-torque protection feature connected between the opening and the sidewall, the over-torque protection feature comprising at least one structural member that is a structurally weakest link between the opening and the sidewall for protecting the printed circuit board from excessive flexing during fastening, wherein structural failure of the over-torque protection feature creates an audible noise.

31. A method of mounting a printed circuit board to a surface with a housing comprising:
engaging the printed circuit board with at least one sidewall of the housing, housing being formed of a rigid plastic material, one or more mounts being integrally formed with the at least one sidewall extending generally perpendicular therefrom in a cantilevered manner, each mount having an opening extending therethrough along an axis A that is generally parallel to the at least one sidewall, the mount having a thickness dimension in the direction of axis A and having two spaced apart bars separated by a slot extending along said thickness dimension that connect the mount to the at least one sidewall; and
securing each mount to the surface with a fastener extending within the opening along axis A, the two bars being configured, shaped and sized to fail when a fastener that is being tightened exerts a force along axis A that reaches a predetermined threshold torque or force level for protecting the printed circuit board from excessive flexing during fastening.

32. An electronic device comprising:
an electronic circuit comprising one or more electronic components mounted to a printed circuit board comprising a thermally conductive substrate layer; and
a package against which the printed circuit board is seated, the package comprising at least one sidewall and one or more mounts via which the electronic device is secured to a heat dissipation object, each mount comprising an opening via which the mount is fastenable to the heat dissipation object and an over-torque protection feature connected between the opening and the sidewall, wherein the over-torque protection feature comprises at least one structural member that is a structurally weakest link between the opening and the sidewall, and comprising at least one rectangular cuboid bar that interconnects a body of the mount with the sidewall.

33. A package for an electronic circuit including one or more electronic components mounted to a printed circuit board including a thermally conductive substrate layer, comprising:
at least one sidewall against which the printed circuit board is seated and one or more mounts via which the printed circuit board is secured to a heat dissipation object, each mount comprising an opening via which the mount is fastenable to the heat dissipation object and an over-torque protection feature connected between the opening and the sidewall, the over-torque protection feature comprising at least one structural member that is a structurally weakest link between the opening and the sidewall, wherein the over-torque protection feature comprises first and second rectangular cuboid bars with a void therebetween.

34. A housing for mounting a printed circuit board to a surface comprising:
at least one sidewall for engaging the printed circuit board; and
one or more mounts integrally extending from the at least one sidewall generally perpendicular therefrom in a cantilevered manner, each mount having an opening extending therethrough along an axis A that is generally parallel to the at least one sidewall for allowing the mount to be secured to the surface with a fastener, each mount being configured, shaped and sized to form a mechanical fuse to break when a fastener that is being tightened exerts a force along axis A that reaches a predetermined threshold level of torque or force for protecting the printed circuit board from excessive flexing during fastening.

35. A method of mounting a printed circuit board to a surface with a housing comprising:
engaging the printed circuit board with at least one sidewall of the housing, one or more mounts extending from the at least one sidewall generally perpendicular therefrom in a cantilevered manner, each mount having an opening extending therethrough along an axis A that is generally parallel to the at least one sidewall; and
securing each mount to the surface with a fastener extending within the opening along axis A, each mount being configured, shaped and sized to form a mechanical fuse to break when a fastener that is being tightened exerts a force along axis A that reaches a predetermined threshold level of torque or force for protecting the printed circuit board from excessive flexing during fastening.

* * * * *